(12) United States Patent
Valley et al.

(10) Patent No.: US 7,620,529 B2
(45) Date of Patent: Nov. 17, 2009

(54) METHOD, APPARATUS, AND COMPUTER PROGRAM PRODUCT FOR SIMULATION OF MIXED-SIGNAL SYSTEMS

(75) Inventors: George C. Valley, Los Angeles, CA (US); Peter Petre, Oak Park, CA (US); Shubha Kadambe, Thousand Oaks, CA (US); Todd S. Kaplan, Los Angeles, CA (US)

(73) Assignees: HLR Laboratories, Malibu, CA (US); Aerospace Corporation, Los Angeles, CA (US)

( * ) Notice: Subject to any disclaimer, the term of this patent is extended or adjusted under 35 U.S.C. 154(b) by 483 days.

(21) Appl. No.: 10/685,352

(22) Filed: Oct. 14, 2003

(65) Prior Publication Data

US 2004/0172226 A1 Sep. 2, 2004

Related U.S. Application Data

(60) Provisional application No. 60/418,044, filed on Oct. 12, 2002.

(51) Int. Cl.
*G06F 7/60* (2006.01)
*G06F 17/10* (2006.01)

(52) U.S. Cl. .................................. 703/2; 703/3; 703/13
(58) Field of Classification Search ....................... 703/2
See application file for complete search history.

(56) References Cited

OTHER PUBLICATIONS

Sangiovanni-Vincentelli "Design Methodologies for Analog and RF Integrated circuits" 1999-2000.*

Chang "Wavelet-Based Galerkin Method for Semiconductor Devices SImulation" 1998 iEEE.*

Ruehli et al. "Progress in the Methodologies for the Electrical Modeling of Interconnects and Electronic Packages.", IEEE May 2001.*

Y. Ahmed, A. Opal, "An efficient simulation method for oversampled delta-sigma modulators," Proc. of the 37th Midwest Symp. on.Circuits and Systems, vol. 2, 1994, pp. 1164-1167.

A. Opal, "Sampled data simulation of linear and nonlinear circuits," IEEE Trans. CAD Integrated Circuits and Syst., vol. 15, No. 3, Mar. 1996, pp. 295-307.

Y. Dong, et al, "Time-domain ther. noise sim. of switched capacitor circ. and delta-sigma modulators," IEEE Trans. CAD Int. Circ. and Syst., vol. 19, No. 4, Apr. 2000, pp. 473-481.

(Continued)

*Primary Examiner*—Kamini Shah
*Assistant Examiner*—Saif Alhija
(74) *Attorney, Agent, or Firm*—Tope McKay

(57) ABSTRACT

The present invention comprises a method, an apparatus, and a computer program product for simulating a mixed-signal system. The invention comprises a first operation of generating a matrix-based wavelet operator representation of equations characterizing a system, with the matrix-based wavelet operator representation including wavelet connection coefficients. A second operation is performed by selecting a number of wavelets and a set of wavelet basis functions with which to represent a performance of the system, whereby the wavelet operator, the number of wavelets and the set of wavelet basis functions represent a wavelet model of the system. A third operation is performed by iteratively applying the wavelet model over a series of clock cycles to develop a behavioral model of the system. The invention has particular use in the area of computer-aided design and may be applied to any suitable system, whether electrical, mechanical, or other.

42 Claims, 8 Drawing Sheets

OTHER PUBLICATIONS

R. Schreier and B. Zhang, "Delta-Sigma modulators employing continuous-time circuitry," IEEE Trans. Circuits and Syst. I, vol. 43, No. 4, Apr. 1996, pp. 324-332.

J.A. Cherry, et al., "Approaches to simulating continuous-time delta-sigma modulators," Proc.of 1998 IEEE Int'l Sym. on Circ. and Sys., ISCAS'98, vol. 1, 1998, pp. 587-590.

D. Zhou, W. Cai, and Wu Zhang, "An adaptive wavelet method for nonlinear circuit simulation," IEEE Trans. Circuits and Syst. I, vol. 46, No. 8, Aug. 1999, pp. 931-938.

A.P.S. Meliopoulos and C.-H. Lee, "An alternative method for transient analysis via wavelets," IEEE Trans. Power Delivery, vol. 15, No. 1, Jan. 2000, pp. 114-121.

A.W. Galli, "Discussion of 'An alternative method for transient analysis via wavelets,'" Ibid, No. 4, Oct. 2000, p. 1326.

A.P.S. Meliopoulos and C.-H. Lee, "Closure to discussion of 'An alternative method for transient analysis via wavelets,'" Ibid, No. 4, Oct. 2000, pp. 1326-1327.

G. Raghavan, et al, "Arch., design, and test of contin.-time tunable interm.-freq. bandpass delta-sigma modulators," IEEE J. Solid-State Circ., vol. 36, No. 1, Jan. 2001,pp. 5-13.

H.L. Resnikoff and R.O. Wells, Jr., "Wavelet Analysis," Springer, New York, 1998, pp. 236-265 .

H.L. Resnikoff and R.O. Wells, Jr., "Wavelet Analysis," Springer, New York, 1998, pp. 281-340.

W.H. Press, et al., "Numerical Recipes in Fortran, the Art of Scientific Computing," 2nd Ed., Cambridge University Press, 1992, pp. 340-386.

G. Beylkin, "On the representation of operators in bases of compactly supported wavelets," Siam J. of Num. ana., vol. 6, No. 6, Dec. 1992, pp. 1716-1740.

M. Unser, et al., "Polynomial Splines and Wavelets—A Signal Processing Perspective," ed. By C.K. Chui, Academic Press, New York, 1992, pp. 91-122.

\* cited by examiner

METHOD, APPARATUS, AND COMPUTER PROGRAM PRODUCT FOR SIMULATION OF MIXED-SIGNAL SYSTEMS

PRIORITY CLAIM

This application claims the benefit of priority to provisional patent application 60/418,044, filed Oct. 12, 2002 with the U.S. Patent and Trademark Office, and titled "Method, Apparatus, and Computer Program Product for Simulation of Mixed-signal Circuits."

GOVERNMENT RIGHTS

This invention is related to work performed in contract with the U.S. Government under DARPA ITO Contract #N66001-01-C-8042, "DARPA NeoCAD", and the U.S. Government may have certain rights in this invention.

BACKGROUND OF THE INVENTION (1) Technical Field

The present invention relates to techniques for system simulations. More specifically, the present invention relates to a technique for using wavelet operator to simulate the performance of mixed-signal circuits.

(2) Discussion

Mixed-signal circuits, an example of which is the delta-sigma modulator, include both analog and digital functionality on the same chip and are difficult to simulate with conventional CAD software, such as SPICE or Simulink, for three main reasons: (1) they are described by a large number of equations; (2) the equations involve highly discontinuous non-linear operations at the clock period of the digital circuit; and (3) the equations are currently solved using slow, time-marching, algorithms (Runge-Kutta type).

Recently, several approaches to fast simulation of mixed-signal circuits have been presented. Several are listed in the set of references below and are described here. Opal et al. presented a basic approach for circuits with a clock period in which linear differential equations are solved by one matrix multiply per clock cycle. In their method, a strong nonlinearity, such as the quantizer in a delta-sigma modulator, is simulated with a behavioral model at each clock period. Schreier and Zhang use a similar approach to construct recursion relations that update state variables of a delta-sigma modulator from time t to time t+$T_c$, where $T_c$ represents the clock period. Cherry and Snelgrove compare three approaches: the recursion relation or direct integration approach, the time-marching method, and a z-domain extraction procedure, which were intended to combine the speed of the recurrence relations with the versatility of the time-marching method. Zhou et al., and Meliopoulos and Lee, have considered wavelet methods for use in general nonlinear circuit simulation and transient analysis.

There are several problems with the above-mentioned techniques. The matrix operator and direct integration methods are not sufficiently general to solve realistic circuit problems. The matrix in the matrix method is difficult to derive and is not small or sparse in general. The time-marching method is slow. The z-domain extraction procedure is difficult to generalize for real circuits. The wavelet techniques considered by Zhou et al., and Meliopoulos and Lee, could not be applied to mixed-signal circuits because of the number of wavelets required for time simulation over an entire time interval of $2^{14}$ or more clock periods needed for analyzing mixed-signal circuits.

Accordingly, there exists a need in the art for a technique that overcomes the aforementioned limitations and that permits the use of wavelet operators to simulate the performance of systems in general, and mixed-signal circuits in particular.

The following references are provided for additional, non-critical, information that may be of use to the reader (all are hereby incorporated herein by reference in their entirety):

[1] Y. Ahmed and A. Opal, "An efficient simulation method for oversampled delta-sigma modulators," Proceedings of the 37th Midwest Symposium on Circuits and Systems, vol. 2, 1994, pp. 1164-1167.

[2] A. Opal, "Sampled data simulation of linear and nonlinear circuits," IEEE Trans. CAD Integrated Circuits and Syst., vol. 15, no. 3, March 1996, pp. 295-307.

[3] Y. Dong and A. Opal, "Time-domain thermal noise simulation of switched capacitor circuits and delta-sigma modulators," IEEE Trans. CAD Integrated Circuits and Syst., vol. 19, no. 4, April 2000, pp. 473-481.

[4] R. Schreier and B. Zhang, "Delta-Sigma modulators employing continuous-time circuitry," IEEE Trans. Circuits and Syst. I, vol. 43, no. 4, April 1996, pp. 324-332.

[5] J. A. Cherry and W. M. Snelgrove, "Approaches to simulating continuous-time delta-sigma modulators," Proceedings of the 1998 IEEE International Symposium on Circuits and Systems, ISCAS '98, vol. 1, 1998, pp. 587-590.

[6] D. Zhou, W. Cai, and Wu Zhang, "An adaptive wavelet method for nonlinear circuit simulation," IEEE Trans. Circuits and Syst. I, vol. 46, no. 8, August 1999, pp. 931-938.

[7] A. P. S. Meliopoulos and C.-H. Lee, "An alternative method for transient analysis via wavelets," IEEE Trans. Power Delivery, vol. 15, no. 1, January 2000, pp. 114-121. A. W. Galli, "Discussion of 'An alternative method for transient analysis via wavelets,'" Ibid, no. 4, October 2000, p. 1326. A. P. S. Meliopoulos and C.-H. Lee, "Closure to discussion of 'An alternative method for transient analysis via wavelets,'" Ibid, no. 4, October 2000, pp. 1326-1327.

[8] M. Unser and A. Aldroubi, Polynomial Splines and Wavelets—A Signal Processing Perspective, in Wavelets: A Tutorial in Theory and Applications, ed. by C. K. Chui, Academic Press, New York, 1992, pp. 91-122.

[9] H. L. Resnikoff and R. O. Wells, Jr., Wavelet Analysis, Springer, N.Y., 1998, pp. 236-265, 281-340.

[10] G. Raghavan, J. F. Jensen, J. Laskowski, M. Kardos, M. G. Case, M. Sokolich, and S. Thomas III, "Architecture, design, and test of continuous-time tunable intermediate-frequency bandpass delta-sigma modulators," IEEE J. Solid-State Circuits, vol. 36, no. 1, January 2001, pp. 5-13.

[11] T. Kaplan, P. Petre and G. C. Valley, "State variable simulation of non-idealities in a continuous time delta-sigma modulator," submitted to IEEE J. CAD Integrated Circuits and Syst., May 2002.

[12] W. H. Press, S. A Teukolosky, W. T. Vetterling, and B. P. Flannery, Numerical Recipes in Fortran, the Art of Scientific Computing, Second Edition, Cambridge University Press, 1992pp. 340-386.

[13] O. C. Zienkiewicz and R. L. Taylor, Finite Element Method: Volume 1 The Basis, Butterworth and Heinemann, Oxford, 2000.

[14] G. Beylkin, "On the representation of operators in bases of compactly supported wavelets,", SIAM Journal of Numerical analysis, vol. 6, no. 6, December 1992, pp. 1716-1740.

SUMMARY OF THE INVENTION

The present invention comprises a method, an apparatus, and a computer program product for simulating a mixed-signal system. In one aspect, the invention comprises operations of generating a matrix-based wavelet operator representation of equations characterizing a system, with the matrix-based wavelet operator representation including wavelet connection coefficients. The next operation is selecting a number of wavelets and a set of wavelet basis functions with which to represent a performance of the system, whereby the wavelet operator, the number of wavelets and the set of wavelet basis functions represent a wavelet model of the system. The next operation is iteratively applying the wavelet model over a series of clock cycles to develop a behavioral model of the system.

In another aspect, the system modeled is an electrical circuit, and the circuit may, more specifically, be a delta-sigma modulator.

In yet another aspect, in the generating operation, the matrix-based wavelet operator is developed by a wavelet-Galerkin method.

In a further aspect, in the generating operation, the matrix-based wavelet operator is developed directly from a system diagram or from equations that describe the system.

In a yet further aspect, in the operation of selecting, the number of wavelets is selected independently for each iteration of the acts of the method.

In a still further aspect, in the selecting operation, the set of wavelet basis functions is selected independently for each iteration of the acts of the method.

In a still further aspect, the invention further comprises operations of receiving a specification for a system model and outputting the behavioral model of the system.

One skilled in the art will appreciate that the operations described here have parallels in acts of a method, means of an apparatus, and means of a computer program product. In particular, the means of an apparatus and of a computer program product may be in the form of either software or a hard-coded instruction set.

In addition, one skilled in the art will appreciate that a variety of additional aspects may be derived from combinations of the above aspects, and that these combinations are considered within the scope of the present invention.

BRIEF DESCRIPTION OF THE DRAWINGS

The objects, features and advantages of the present invention will be apparent from the following detailed descriptions of the preferred aspect of the invention in conjunction with reference to the following drawings.

FIG. 5($b$) is an expanded view of a portion of the graph shown in FIG. 5($a$);

FIG. 6($b$) is an expanded view of a portion of the graph shown in FIG. 6($a$).

DETAILED DESCRIPTION OF PREFERRED ASPECTS

Figure 1:
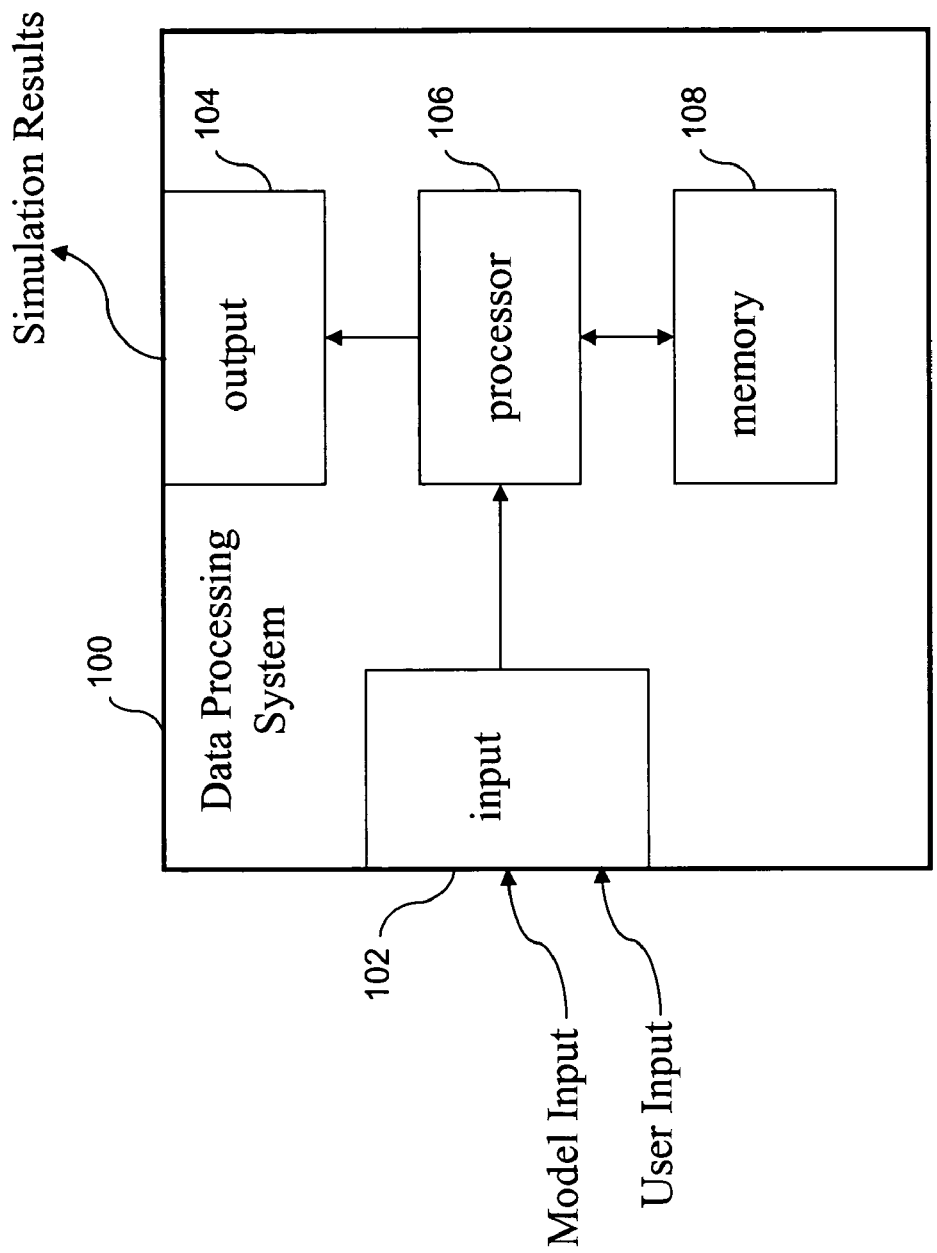
FIG. 1 is a block diagram of a computer system that may be used in conjunction with the present invention.

The present invention relates to techniques for system simulations. More specifically, the present invention relates to a technique for using wavelet operators to simulate the performance of mixed-signal circuits. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein, may be applied to a wide range of aspects. Thus, the present invention is not intended to be limited to the aspects presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

In order to provide a working frame of reference, first a glossary of terms used in the description and claims is given as a central resource for the reader. Next, a discussion of various physical aspects of the present invention is provided. Finally, a discussion is provided to give an understanding of the specific details.

(1) Glossary

Before describing the specific details of the present invention, a centralized location is provided in which various terms used herein and in the claims are defined. The glossary provided is intended to provide the reader with a general understanding of the intended meaning of the terms, but is not intended to convey the entire scope of each term. Rather, the glossary is intended to supplement the rest of the specification in more accurately explaining the terms used.

Means—The term "means" as used with respect to this invention generally indicates a set of operations to be performed on a computer, and may represent pieces of a whole program or individual, separable, software modules. Non-limiting examples of "means" include computer program code (source or object code) and "hard-coded" electronics (i.e. computer operations coded into a computer chip). The "means" may be stored in the memory of a computer or on a computer readable medium.

(2) Physical Aspects

The present invention has three principal "physical" aspects. The first is a system, typically in the form of a computer system operating software or in the form of a "hard-coded" instruction set. This system may either serve as the basis for a stand-alone system analysis package or may be integrated with other computer-aided design (CAD) and simulation programs. The second physical aspect is a method, typically in the form of software, operated using a data processing system (computer). The third principal physical aspect is a computer program product. The computer program product generally represents computer readable code stored on a computer readable medium such as an optical storage device, e.g., a compact disc (CD) or digital versatile disc (DVD), or a magnetic storage device such as a floppy disk or magnetic tape. Other, non-limiting examples of computer readable media include hard disks, read only memory (ROM), and flash-type memories. These aspects will be described in more detail below.

A block diagram depicting the components of a computer system used in the present invention is provided in FIG. 1. The data processing system 100 comprises an input 102 for receiving specifications of a system—this may be in the form of a system diagram or in the form of equations representing a system. Note that the input 102 may include multiple "ports". Typically, input is received through standard input/output devices, non-limiting examples of which include a keyboard, mouse, hard drive, floppy drive, network connection, etc. The output 104 is connected with the processor for providing information regarding the analysis for display to a user via devices such as printers and computer monitors. Output may also be provided to other devices or other programs, e.g. to other software modules, for use therein. The input 102 and the output 104 are both coupled with a processor 106, which may be a general-purpose computer processor or a specialized processor designed specifically for use with the present invention. The processor 106 is coupled with a memory 108 to permit storage of data and software to be manipulated by commands to the processor.

Figure 2:
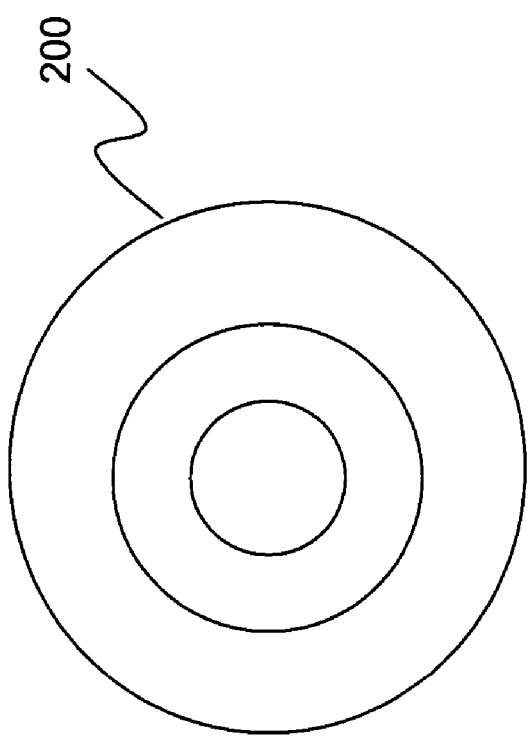
FIG. 2 is an illustrative diagram of a computer program product embodiment of the present invention.

An illustrative diagram of a computer program product embodying the present invention is depicted in FIG. 2. The computer program product 200 is depicted as an optical disk such as a CD or DVD. However, as mentioned previously, the computer program product generally represents computer readable code stored on any compatible computer readable medium.

(3) Introduction

The present invention provides a technique that can be used to simulate the performance of a wide variety of systems, non-limiting examples of which include mechanical and electrical systems. Although it is readily applicable to the analysis of a broad range of system types (mechanical, electrical, etc.), the present invention will be discussed herein in the context of calculating the temporal response of mixed-signal circuits. In particular, such a system has application to the next generation of computer aided design (CAD) software for circuit design and analysis. It is contemplated that one of skill in the art would readily be able to adapt the techniques presented herein to other systems without difficulty.

The present invention provides a technique in which a system simulation is broken up into clock periods, and the calculation within each clock period, which is weakly non-linear, is performed by matrix multiplication. Also, the technique allows the discontinuous non-linearity to be applied separately at the end of the clock period. The entire simulation can be performed by repeating this process for the required number of clock periods. Since the technique presented is much faster than time-marching algorithms that require small time steps to simulate the discontinuous non-linearity, a much larger number of equations can be simulated in reasonable computer run times.

In one aspect, the present invention uses the wavelet-Galerkin method to derive a matrix representative of the system to be analyzed. This matrix, which is used during each clock period of the analysis, is derived from a set of differential equations that describe the system. This matrix can also be directly derived from a circuit-type schematic of the system. Techniques are also described for optimizing the representation of the system. Examples are provided to clearly explain how the invention may be applied. Specifically, for the purpose of explanation, a $4^{th}$ order delta-sigma modulator is used as an example, and the results are in excellent agreement with conventional calculations. The invention may be applied to any time-based mixed-signal system that operates on a clock-basis with strong or discontinuous non-linearity at the clock period and that can be described by conventional linear or non-linear, integral or differential, equations for the state variables (e.g., current, voltage, or temperature) during the clock period.

The invention provides for faster simulations of mixed-signal systems than the simulations obtained with conventional techniques. Furthermore, the speed advantage permits more calculations to be performed during a given time period for system optimization. Thus, this invention can be used to solve a more complex set of equations in the same amount of time so that low-level (transistor-level, in the case of electrical circuits) simulations may be performed for systems that were previously only capable of being simulated at the behavioral level. The use of wavelet expansion techniques to simulate system performance permits higher resolution simulations for the same run time, because the wavelets can be chosen to fit the details of the circuit.

Each clock period in a simulation requires one wavelet transform of the input and any applicable feedback signals in the system, but the transform can be performed using a fast wavelet transform technique. The wavelet-Galerkin matrix operator, which is used during a clock period, can be derived directly from the circuit layout. This feature makes the technique of the present invention attractive for applications such as CAD.

Non-linearities within the clock period can be simulated with the techniques presented by using any one of many well-known iterative solving techniques with the fast wavelet transform and the collocation point method. Higher-order partial differential equations for state variables can be simulated with this technique by setting the first derivative of the state variable equal to a new state variable and adding an equation for this new state variable; or directly in the wavelet-Galerkin approach by using a wavelet basis for which the connection coefficients for the higher-order derivatives exists.

Figure 3:
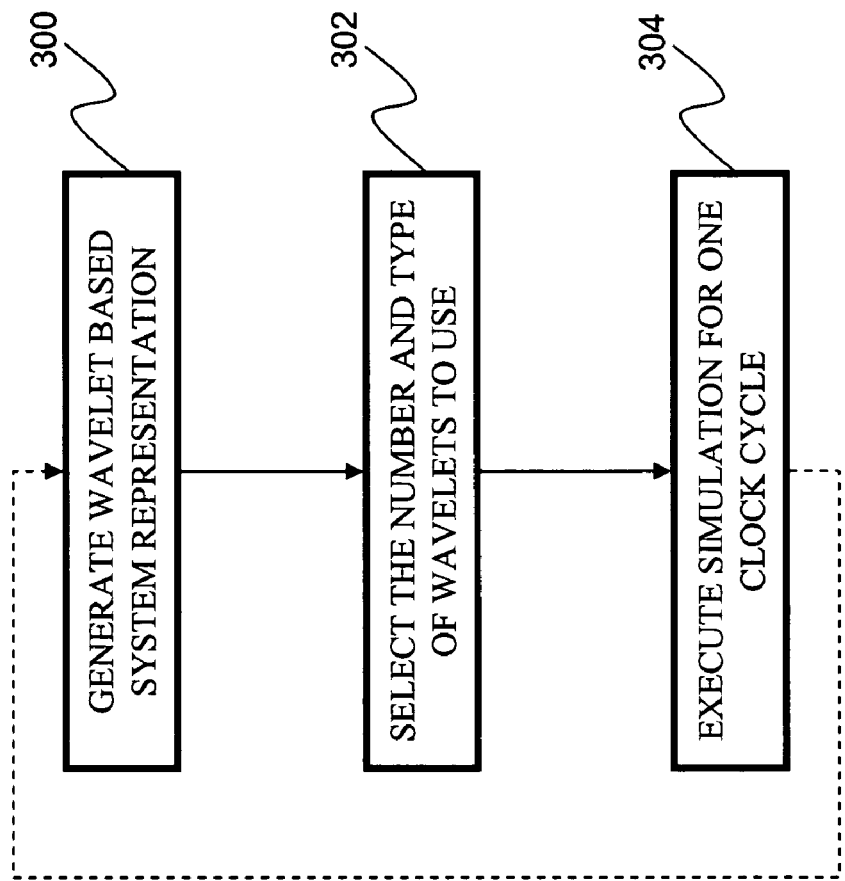
FIG. 3 is a flowchart depicting the general operations of the present invention.

The general operations performed by the present invention are depicted in the flowchart shown in FIG. 3. In the first operation, a matrix-based wavelet operator representation of equations characterizing a system is generated 300, with a matrix including wavelet connection coefficients. Next, a number of wavelets and a set of wavelet basis functions are selected 302 for representing the performance of the system. The wavelet operator, the number of wavelets, and the set of wavelet basis functions represent a wavelet model of the system. This wavelet model is applied 304 over a series of clock cycles to develop a behavioral model of the circuit (the repetitive application is represented by the dashed line in the diagram).

The approach presented herein will now be explained in greater detail by use of an example. The example presented is an electrical circuit. It is important to note, however, that the present invention is not limited either to this specific electrical circuit, or to electrical circuits in general, and that it may be applied to a broad range of systems.

(4) Exemplary Description a. Delta-Sigma Modulator Specification

The present invention will now be described in detail with reference to a specific example of a mixed-signal system, specifically, a $4^{th}$ order continuous-time delta-sigma modulator (a mixed-signal electrical circuit). For more background regarding the design and implementation of continuous-time delta-sigma modulators, the reader is referred to the reference by G. Raghavan et al., cited in the set of references above.

Except as provided herein, specific design issues related to delta-sigma modulators are not considered necessary to understand or practice the present invention.

Figure 4:
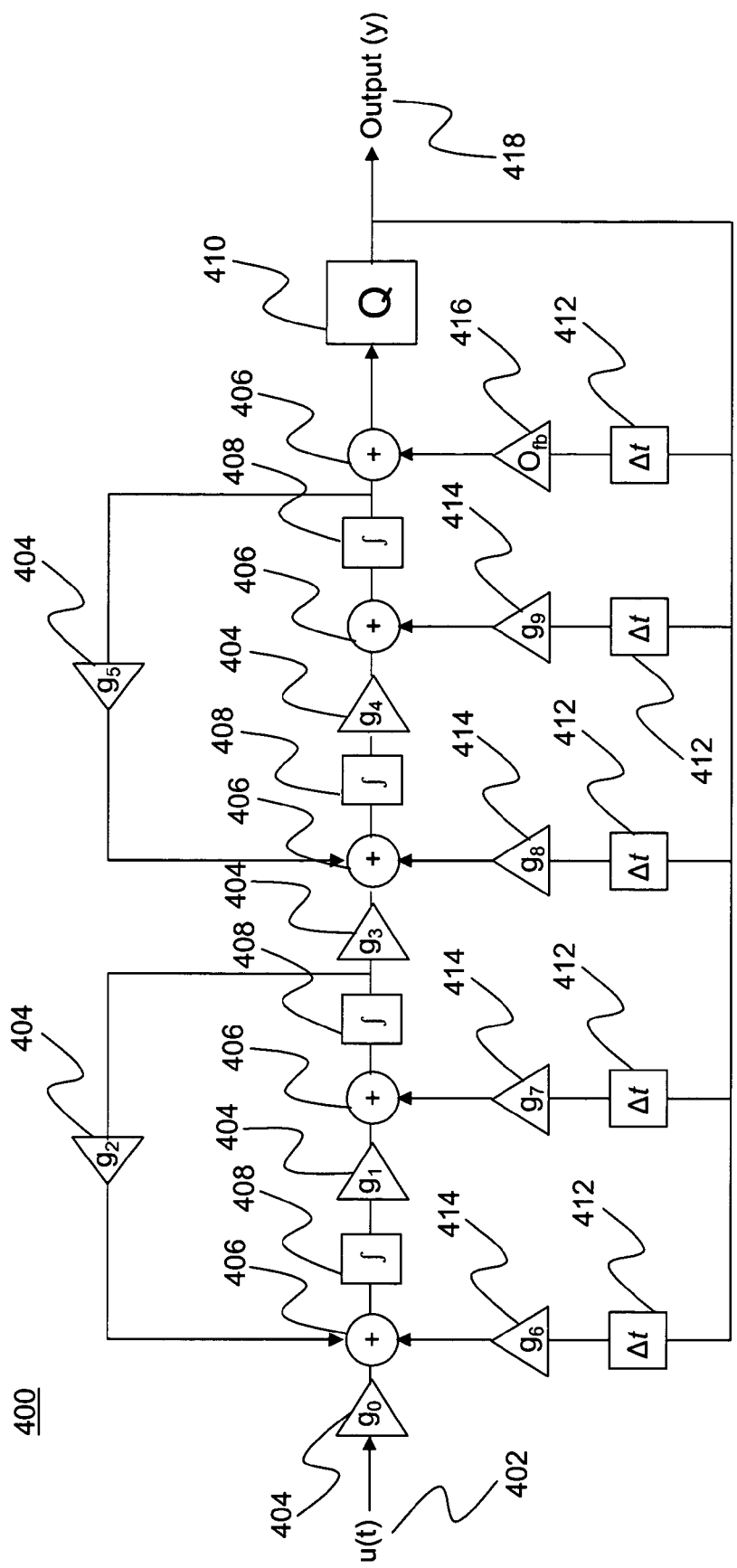
FIG. 4 is a circuit diagram of a continuous-time delta-sigma modulator used as an example of a system to which the present invention may be applied for analysis.

A circuit diagram of a continuous-time delta-sigma modulator used in this example is presented in FIG. 4. As shown, the delta-sigma modulator 400 comprises an input 402 leading to the first of a set of transconductance amplifiers 404 ($g_{0-5}$) that are arranged as shown. The delta-sigma modulator 400 also includes a plurality of adders 406, transimpedance integrators 408 ($1/sC_i$), a single quantizer 410, a set of delays 412, a set of digital-to-analog converters (DACs) 414 ($g_{6-9}$), and a voltage amplifier 416 ($Q_{fb}$). An output 418 of the quantizer 410 is simulated in this example. Note that the symbols in the figure are summarized as follows:

$g_i$ represent gain cells;
+ represent adders;
$C_i$ represent integrators;
$\Delta t$ represent time delays;
Q represents the quantizer; and
u(t) represents the input to the delta-sigma modulator.

The equations for the delta-sigma modulator of FIG. 4 are as follows:

$$C_1 \frac{\partial x_1(t)}{\partial t} = g_0 u(t) - g_2 x_2(t) - g_6 y(t - \Delta t); \quad (1)$$

$$C_2 \frac{\partial x_2(t)}{\partial t} = g_1 x_1(t) - g_7 y(t - \Delta t); \quad (2)$$

$$C_3 \frac{\partial x_3(t)}{\partial t} = g_3 x_2(t) - g_5 x_4(t) - g_8 y(t - \Delta t); \quad (3)$$

$$C_4 \frac{\partial x_4(t)}{\partial t} = g_4 x_3(t) - g_9 y(t - \Delta t); \text{ and} \quad (4)$$

$$y = sgn[x_4(t_n) + Q_{fb} y(t_{n-1})]; \text{ where} \quad (5)$$

$x_i$ are the voltages following the integrators $C_i$;
y is the output of the quantizer; and
the other symbols are as mentioned previously. Also, the clock period is $T_c$ and $t_n = nT_c$ is the time at the end of the $n^{th}$ clock cycle.

b. Derivation of the Wavelet Operator

Given the delta-sigma modulator definition just provided, the next step is to convert the equations (1)-(5) into a matrix equation. To do so, the wavelet-Galerkin method presented in H. L. Resnikoff and R. O. Wells, Jr., Wavelet Analysis, Springer, N.Y., 1998, pp. 236-265, 281-340 (incorporated by reference herein in its entirety) is used. Note that the use of the wavelet-Galerkin method is for exemplary purposes only, and is not intended to limit the scope of the present invention.

The bounded domain in this case is a single clock period, and the wavelet-Galerkin method is repetitively applied for the number of clock periods in the full simulation. Since the output 418 $y(t_n)$ is held fixed for $t_n < t < t_n + T_c$, both the output 418 y(t) and the input 402 u(t) are known functions during the clock period and remain on the right hand side of equations (1)-(4). These functions plus the boundary conditions for the state variables are expanded in a set of wavelet basis functions. Then, the state variables are expanded in the same set of wavelet basis functions that enable the wavelet transform of equations (1)-(4) to be put in a matrix representation:

$$\begin{pmatrix} C_1\Gamma & g_2 I & 0 & 0 \\ -g_1 I & C_2\Gamma & 0 & 0 \\ 0 & -g_3 I & C_3\Gamma & g_5 I \\ 0 & 0 & -g_4 I & C_4\Gamma \end{pmatrix} X = R, \text{ where} \quad (6)$$

$\Gamma$ represents a matrix of the wavelet connection coefficients that relates the wavelet expansion of the derivative of a function to the expansion of the function itself (equivalently, the connection coefficients relate the derivative of the scaling and wavelet functions to the functions themselves);

I is the identity matrix; and

X is the voltage vector corresponding to the wavelet expansion coefficients of $x_1$ through $x_4$ and R to the expansion coefficients of the right hand sides of equations (1)-(4).

If m wavelets basis functions are used per state variable, then the dimensions of $\Gamma$, I, and 0 are m×m, while X and R are 4 m long. It is evident that the matrix in Equation (6) is quite sparse (r and I are also sparse sub-matrices), and the other 0 matrices on the left of Equation (6) reflect the fact that there are relatively few connections between the circuit nodes shown in FIG. 4. It should be noted that Equation (6) does not depend on the number of wavelet basis functions or the type of wavelet basis functions. The invention requires solely that the wavelet basis functions chosen for analysis have a connection coefficient matrix. Note that the article by H. L. Resnikoff et al., just mentioned, provides explicit formulas for connection coefficients for wavelets of genus 1 to 6 and suggests, although it is not mathematically proven, that the connection coefficients may also exist for other wavelets. It is also noteworthy that Equation (6) does not solve equations (1)-(5) simultaneously, but only equations (1)-(4) within a clock period during which y is a known function from previous clock cycles. The technique presented here includes solving Equation (6) by inversion of the matrix on the left-hand side and multiplication of the vector R by this matrix. This yields the wavelet expansion coefficients for the state variables. One final inverse wavelet transform could be used to obtain the full time-dependent state variables within the clock period; but since only the values of the state variables are required at the clock period, a full wavelet transform is not necessary for this example. After the wavelet expansion coefficients for the state variables have been obtained, the quantizer 410 (see FIG. 4 and Equation (5)), input signal 402, and boundary conditions are updated, and the process is repeated for the next clock period. A complete simulation of the delta-sigma modulator typically requires $2^{14}$ or more clock periods that corresponds to $2^{14}$ matrix multiplications plus $2^{14}$ wavelet transforms. For each choice of the wavelet basis and the number of wavelets, the matrix on the left hand side of Equation (6) must be inverted once, but this is unimportant because the time is amortized over $2^{14}$ or more clock cycles. For computational efficiency, the wavelet transform may be performed with the fast wavelet transform algorithm. Further, the number of wavelet basis functions need not be constant from one clock period to another. Larger numbers of basis functions might be used when the input signal varies more rapidly for instance. Similarly, the type of wavelet basis function need not be the same from clock period to clock period. For example, one might use a Haar basis for one clock period and a Daubechies basis for another along with an intelligent adaptive algorithm to choose from a library of pre-computed matrices.

c. Derivation of the Wavelet-Galerkin Matrix from the Circuit Diagram

Note that the wavelet-Galerkin matrix on the left hand side of Equation (6) may be written down by inspection from the circuit diagram in FIG. 4. The procedure used is as follows. Start at the first integrator $C_1$. Since the output of this integrator is $x_1$, it gives rise to a term $C_1\Gamma$ in the first row of the matrix. The input to the integrator consists of $g_0$ u(t), $g_6$ y($t_n-\Delta t$) and $g_2x_2$. The wavelet transform of the sum of the first two terms is the first element of the vector R. The term $g_2x_2$ gives the sub-matrix $g_2$I in the matrix. Similar analysis at the other integrators provides the other rows of the matrix.

d. Reduction to Practice

Figure 5A:
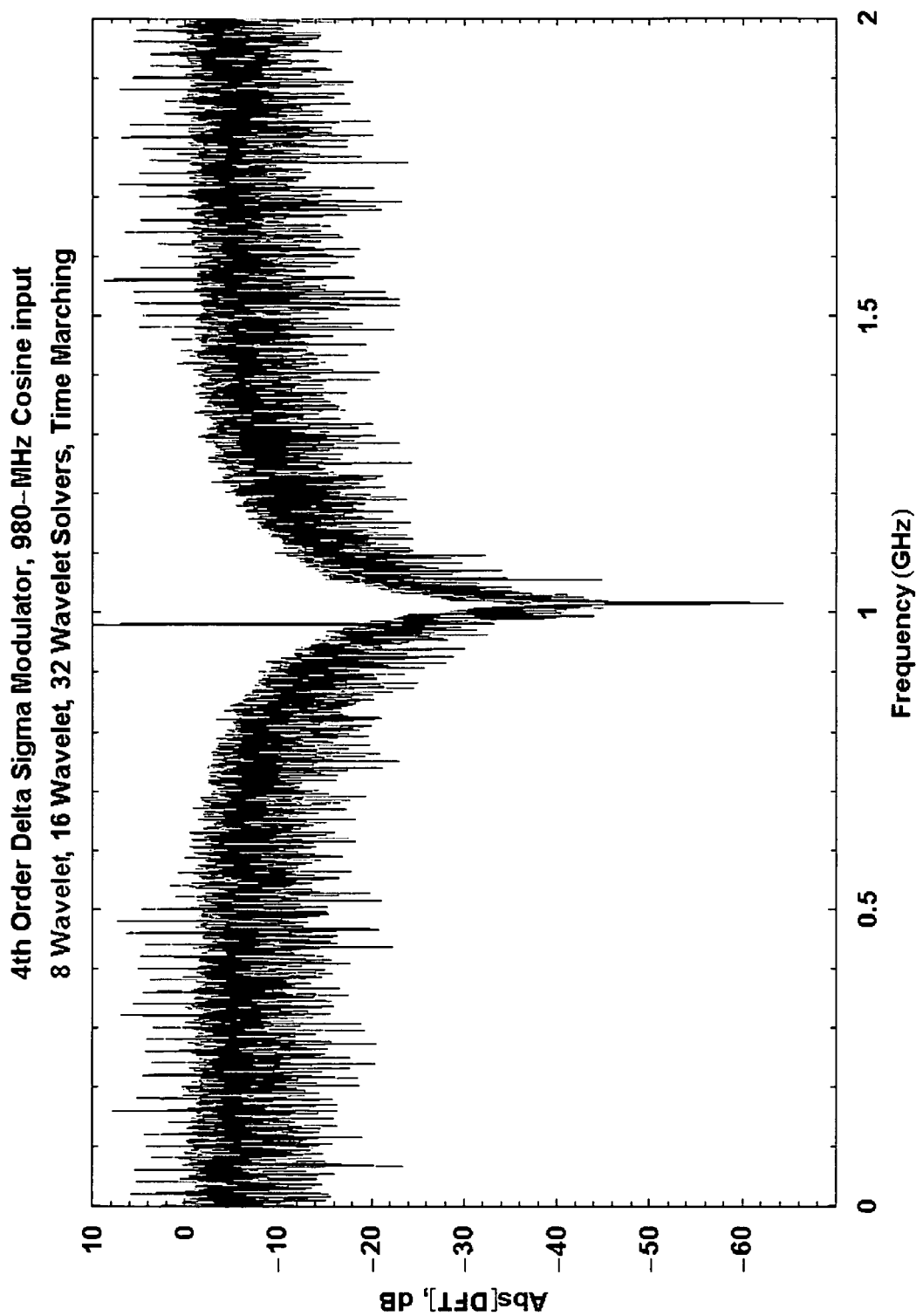
FIG. 5($a$) is a graph depicting the frequency response of the delta-sigma modulator to a 980 MHz cosine input signal, analyzed using 8, 16, and 32 Haar wavelets per state variable, and compared with a time marching solver.
Figure 5B:
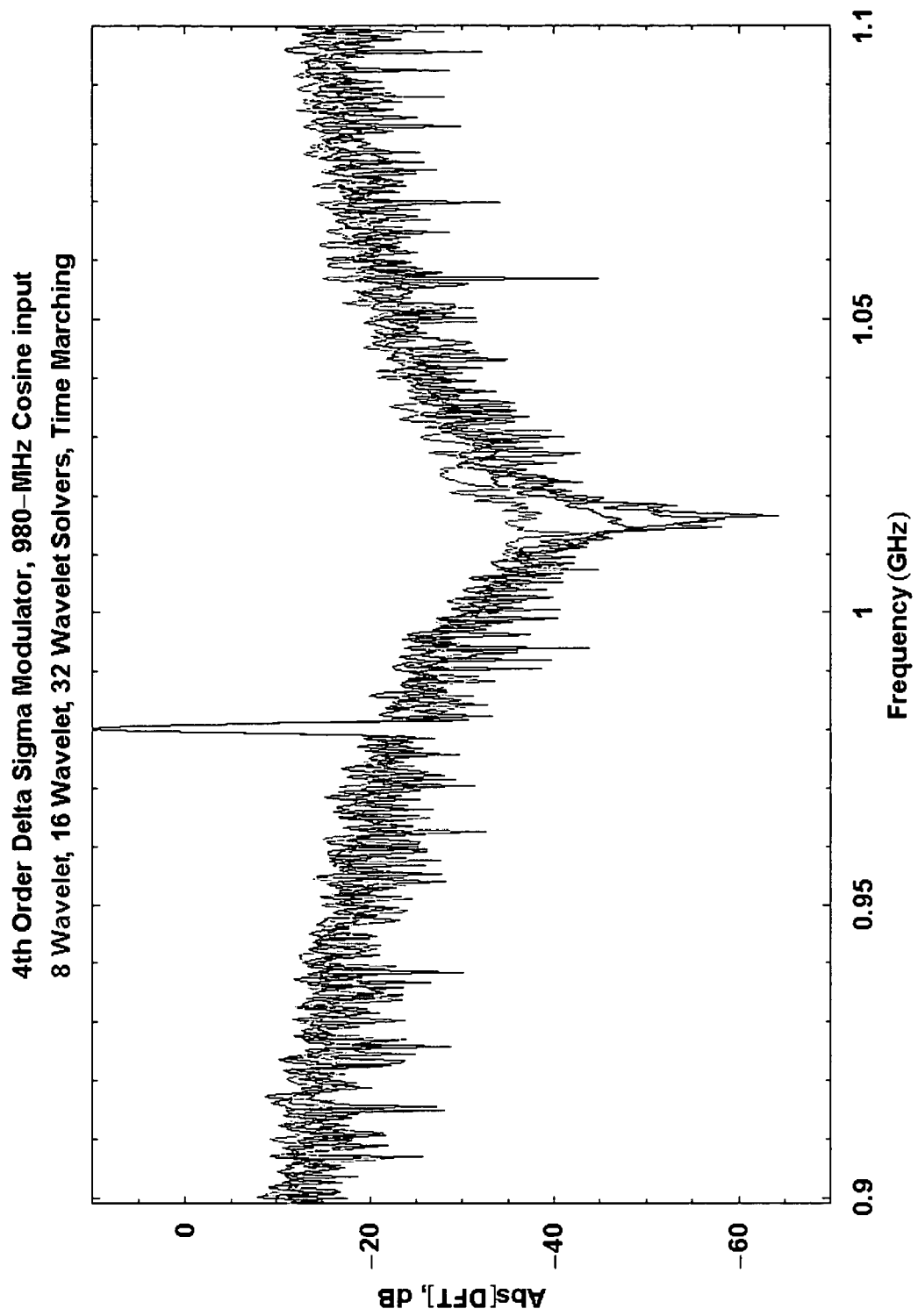

The present invention has been reduced to practice with 8, 16, and 32 Haar wavelets per state variable $x_i$ and these results have been compared to those from a time marching code, which has been independently benchmarked to Simulink calculations (Simulink is a product of The Math Works Inc., 3 Apple Hill Drive, Natick, Mass. 01760-2098, United States). The result of these comparisons are shown in FIG. 5(a) and FIG. 5(b). FIG. 5(a) shows the absolute value of the discrete Fourier transform of the output of the delta-sigma modulator multiplied by the Kaiser Window as a function of frequency for a $4^{th}$ order delta-sigma modulator signal over the full range of frequency from 0 to 2 GHz, and FIG. 5(b) shows the same with an expanded frequency scale showing a sharp notch in modulator frequency response at 1.016 GHz. These calculations use the parameters of the delta-sigma modulator shown in FIG. 4, and assume a 980 MHz cosine signal as input, a clock period of 250 ns, and a DAC delay of $T_c/2$. The output 418 from the quantizer 410,y, consists of a table of 1's and −1's. The spectrum is obtained by multiplication by a Kaiser window function and taking the discrete Fourier transform to obtain a spectral representation of the output signal from the circuit. Note that on the full-scale plot in FIG. 5(a), the results (signal at 980 MHz and average noise level) appear nearly identical regardless of the number of wavelets used per clock cycle, with minor differences in the noise spikes. In the blown-up version shown in FIG. 5(b), it is shown that the wavelet operator code with 8 and 16 Haar wavelets does not predict the sharp "notch" to the right of the signal. This notch is a very sensitive indicator of the quality of the simulation.

e. Extension to Circuit with Nonlinear Elements

The fast wavelet operator method may be extended to circuits that contain nonlinear elements. To illustrate use of the wavelet operator method with a nonlinearity in the delta-sigma modulator, it is assumed that gain cell $g_1$ 404 (see FIG. 4) saturates according to the semi-empirical expression (the algorithm is independent of the detailed form of the nonlinearity), $$g \rightarrow g\left(1 + \frac{v^2}{v_s^2}\right)\mathrm{sech}^2\left[\frac{v}{v_s}\left(1 + \frac{v^2}{3v_s^2}\right)\right], \quad (7)$$

where v is the voltage ($x_1$ for cell $g_1$) and $v_s$ is a constant that characterizes the saturation. The right hand side of the Substitution (7) has a typical bell shaped dependence, e.g., it equals 1 for $v \ll v_s$ and 0 for $v \gg v_s$. Substitution (7) is obtained by fitting an I-V curve for a typical gain cell.

Substitution (7) can be used directly in Equation (2) in the time marching code without further modification. These results, shown in FIGS. 5(a) and 5(b), provide the baseline against which to compare the wavelet results. Specifically, FIG. 5(a) and 5(b) depict noise power/bin as a function of frequency for the exemplary $4^{th}$ order delta-sigma modulator. The wavelet code for this non-linearity makes use of an iterative wavelet solver. Examples of iterative solvers are commonly known to those of skill in the art, and, for the benefit of the reader, several examples are provided in the references in the background. To use the one method, the Equation (2) is rewritten into the following form:

$$C_2\frac{\partial x_2(t)}{\partial t} - g_1x_1(t) = \qquad (8)$$
$$-g_7y(t-\Delta t) - g_1x_1(t) + g_1\left(1 + \frac{x_1(t)^2}{v_s^2}\right)\mathrm{sech}^2\left[\frac{x_1(t)}{v_s}\left(1 + \frac{x_1(t)^2}{3v_s^2}\right)\right]x_1(t),$$

which reduces to Equation (2) for $x_1(t) \ll v_s$. As in the linear case, Haar wavelets are used to illustrate the method, but the method can be used with arbitrary wavelets. The first iteration at each clock cycle is obtained as described above with $x_1(t)$ set to 0 on the right hand side of Equation (8). The second iteration is obtained by using the same wavelet operator but with an added source term on the right hand side corresponding to the saturation term evaluated with the value of $x_1(t)$ obtained in the first iteration. Since the only knowledge of $x_1(t)$ is its wavelet coefficients, this might seem to be a computationally intensive task. Fortunately, existing wavelet computation technology is available for this purpose. A combination of collocation points and fast wavelet coefficient computations is used for this operation. Essentially, for N wavelets, the nonlinear evaluation needs to be performed only N times at the collocation points, and calculation of the new coefficients of the right hand side is completed by the fast wavelet transform.

Since the delta-sigma modulator functions poorly, if at all, with large nonlinear gain saturation, for practical cases of interest, the number of iterations required is less than 10 and often less than 5 for good accuracy. It is obviously advantageous to adaptively control the number of iterations in each clock cycle since the value of $x_1(t)$ is rarely large enough to require much iteration. For mixed signal circuits in which the non-linearity is large within the clock period, it may be necessary to use other iterative solvers. All classes of iterative solves can be used very efficiently because the linear equations are solved with one matrix multiply and the right hand sides are evaluated with the fast wavelet transform.

Figure 6A:
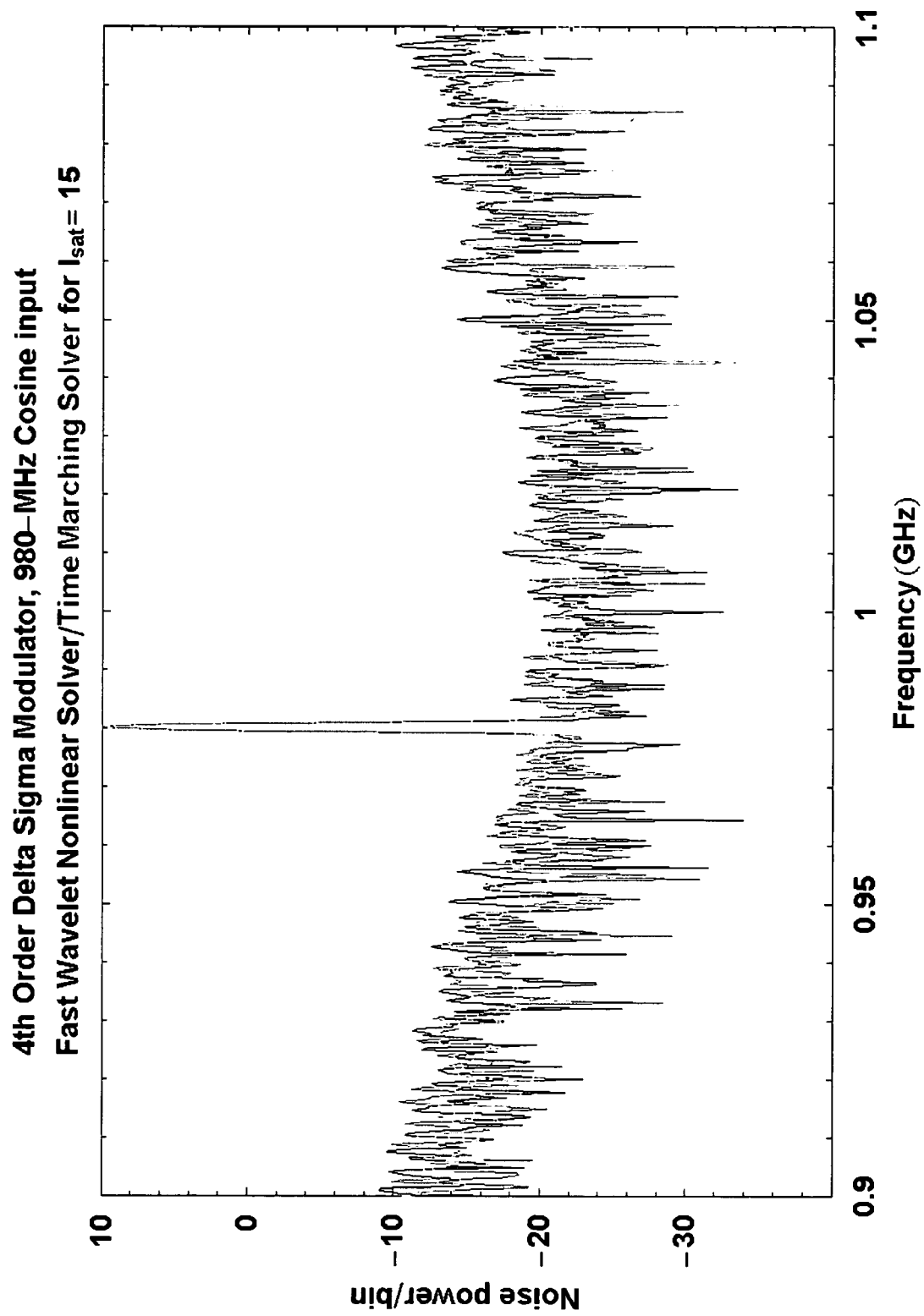
FIG. 6($a$) is a graph depicting the frequency response of the delta-sigma modulator to a 980 MHz cosine input signal, analyzed using a fast wavelet nonlinear solver, and compared with a time marching solver.
Figure 6B:
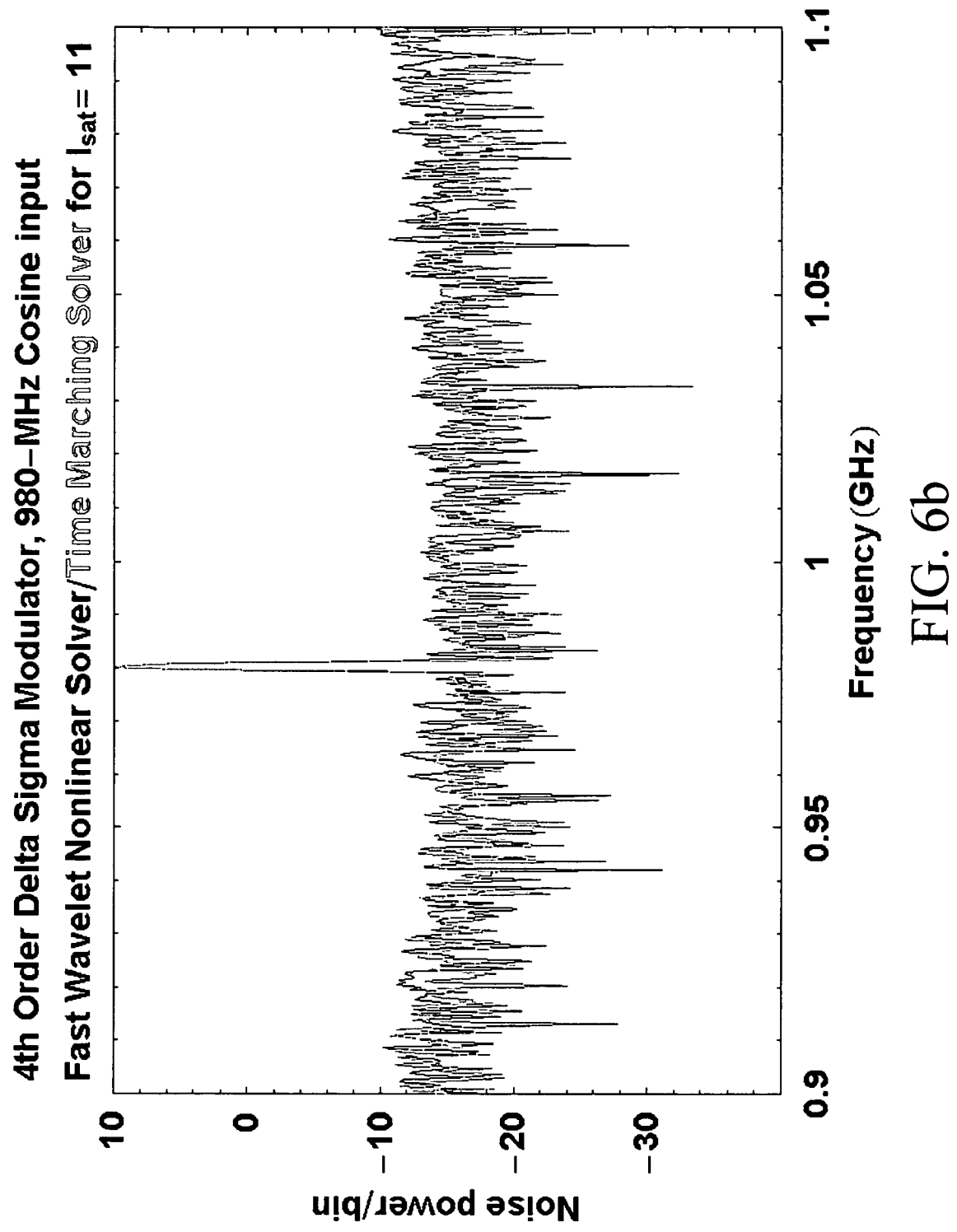

The wavelet operator and the time marching results for the $4^{th}$ order delta-sigma modulator with gain cell $g_1$ 404 saturated are shown in FIGS. 6(a) and 6(b). These results are obtained with 8 Haar wavelets and correspond to the case shown in FIGS. 5(a) and 5(b), but with saturation voltages of $v_s=1.72$ and 2.35 V (for FIGS. 6(a) and 6(b), respectively.

f. Extensions of the Wavelet-Galerkin Method

Several extensions of the wavelet-Galerkin algorithm will be readily ascertainable by one skilled in the art of wavelet analysis. First, the wavelet basis can be chosen to match properties of the circuit. This will help to reduce the size of the matrix. Second, the same wavelet basis need not be used for each clock cycle. An adaptive procedure can be devised so that the wavelet basis changes depending on properties of the input signal, the feedback DAC or other circuit non-idealities. Note that the calculations presented herein were illustrated with a very simple model of the DAC, but the method is not limited to a specific description of the DAC. The properties of the DAC may, however, influence the choice of a wavelet basis. Finally, the number of wavelets used per clock period can vary adaptively depending on the input conditions, the DAC, and any other circuit non-idealities that may be present. It is believed that other extensions of the wavelet-Galerkin method disclosed in this work will be clear to those skilled in conventional Galerkin methods.

g. Extension to Other State Variables

Complete description of the behavior of a system (mixed signal circuit in the example herein) may require other state variables besides current and voltage. For example, in the delta-sigma modulator temperature may affect DAC response. It should be clear that the $x_i$ in equations having the same form as Equations (1)-(5) can correspond to arbitrary state variables that can be described by first order differential equations.

h. Extension to Higher-Order Differential and Integral Equations

The method is not limited to state variables that can be described by first order differential equations. Differential equations with $n^{th}$ order derivatives may be reduced to n first order equations by repeated application of the following technique illustrated for a second order equation. If the original second order differential equation is $d^2x/dt^2=f[dx/dt,x,t]$, and it may be replaced two equivalent first order equations:

$u=dx/dt$ and $du/dt=f[u,x,t]$.

An alternative method for state variables described by higher order differential or integral equations is to use the wavelet-Galerkin method with a wavelet basis for which the connection coefficient matrix for higher order integration or differentiation exists.

What is claimed is:

1. A computer implemented method for simulating a time-domain response of a mixed-signal system comprising acts of:
   breaking up a mixed-signal system simulation into clock periods;
   generating a wavelet-based matrix operator representation of time-domain equations characterizing a mixed signal system, with the wavelet-based matrix operator representation including wavelet connection coefficients;
   selecting a number of wavelets, a set of wavelet basis functions, and the wavelet-based matrix operator with which to represent a time domain performance of the system;
   calculating a time-domain response of the mixed signal system by performing sequentially over a large number of clock cycles an act of:
      iteratively applying the wavelet-based matrix operator within each clock period, wherein the large number of clock cycles is approximately greater than sixteen thousand three hundred and eighty four clock cycles and calculation within each clock period is weakly non-linear, and wherein the calculation within each clock period is performed by matrix multiplication, wherein the weakly non-linear calculation utilizes a linearity measure of approximately less than 50% of a linear portion of the mixed signal system; and
   outputting the time-domain response of the mixed signal system to an user, whereby the user can utilize the time-domain response of the mixed signal system to evaluate the behavioral performance of the system.

2. A method for simulating a mixed-signal system as set forth in claim 1, where the system is an electrical circuit.

3. A method for simulating a mixed-signal system as set forth in claim 2, where the electrical circuit is a delta-sigma modulator.

4. A method for simulating a mixed-signal system as set forth in claim 3, wherein in the generating act, the wavelet-based matrix operator is developed by a wavelet-Galerkin method.

5. A method for simulating a mixed-signal system as set forth in claim 4, wherein in the generating act, the wavelet-based matrix operator is developed directly from a system diagram or from equations that describe the system.

6. A method for simulating a mixed-signal system as set forth in claim 5, wherein in the selecting act the number of wavelets is selected independently for each iteration of the acts of the method.

7. A method for simulating a mixed-signal system as set forth in claim 6, wherein in the selecting act, the set of wavelet basis functions is selected independently for each iteration of the acts of the method.

8. A method for simulating a mixed-signal system as set forth in claim 7, further comprising acts of receiving a specification for a system model and outputting the time-domain response of the system.

9. A method for simulating a mixed-signal system as set forth in claim 1, wherein in the generating act, the wavelet-based matrix operator is developed by a wavelet-Galerkin method.

10. A method for simulating a mixed-signal system as set forth in claim 1, wherein in the generating act, the wavelet-based matrix operator is developed directly from a system diagram.

11. A method for simulating a mixed-signal system as set forth in claim 1, wherein in the generating act, the wavelet-based matrix operator is developed directly from equations that describe the system.

12. A method for simulating a mixed-signal system as set forth in claim 1, wherein in the selecting act the number of wavelets is selected independently for each iteration of the acts of the method.

13. A method for simulating a mixed-signal system as set forth in claim 1, wherein in the selecting act, the set of wavelet basis functions is selected independently for each iteration of the acts of the method.

14. A method for simulating a mixed-signal system as set forth in claim 1, further comprising acts of receiving a specification for a system model and outputting the time-domain response of the system.

15. An apparatus for simulating a time-domain response of a mixed-signal system comprising a data processing system, the data processing system having a processor and a memory coupled with the processor, wherein the memory includes means that are executable by the processor for causing the processor to perform operations of:
   breaking up a mixed-signal system simulation into clock periods;
   generating a wavelet-based matrix operator representation of time-domain equations characterizing a mixed signal system, with the wavelet-based matrix operator representation including wavelet connection coefficients;
   selecting a number of wavelets, a set of wavelet basis functions, and the wavelet-based matrix operator with which to represent a time domain performance of the system;
   calculating a time-domain response of the mixed signal system by performing sequentially over a large number of clock cycles an act of:
      iteratively applying the wavelet-based matrix operator within each clock period, wherein the large number of clock cycles is approximately greater than sixteen thousand three hundred and eighty four clock cycles and calculation within each clock period is weakly non-linear, and wherein the calculation within each clock period is performed by matrix multiplication, wherein the weakly non-linear calculation utilizes a linearity measure of approximately less than 50% of a linear portion of the mixed signal system; and outputting the time-domain response of the mixed signal system to an user, whereby the user can utilize the time-domain response of the mixed signal system to evaluate the behavioral performance of the system.

16. An apparatus for simulating a mixed-signal system as set forth in claim 15, where the system is an electrical circuit.

17. An apparatus for simulating a mixed-signal system as set forth in claim 16, where the electrical circuit is a delta-sigma modulator.

18. An apparatus for simulating a mixed-signal system as set forth in claim 17, wherein the operation of generating develops the wavelet-based matrix operator by a wavelet-Galerkin method.

19. An apparatus for simulating a mixed-signal system as set forth in claim 18, wherein the operation of generating develops the wavelet-based matrix operator directly from a system diagram or from equations that describe the system.

20. An apparatus for simulating a mixed-signal system as set forth in claim 19, wherein the operation of selecting independently selects the number of wavelets for each iteration.

21. An apparatus for simulating a mixed-signal system as set forth in claim 20, wherein the operation of selecting independently selects the set of wavelet basis functions for each iteration.

22. An apparatus for simulating a mixed-signal system as set forth in claim 21, further comprising an operation of receiving a specification for a system model and outputting the time-domain response of the system.

23. An apparatus for simulating a mixed-signal system as set forth in claim 15, wherein the operation of generating develops the wavelet-based matrix operator by a wavelet-Galerkin method.

24. An apparatus for simulating a mixed-signal system as set forth in claim 15, wherein the operation of generating develops the wavelet-based matrix operator directly from a system diagram.

25. An apparatus for simulating a mixed-signal system as set forth in claim 15, wherein the operation of generating develops the wavelet-based matrix operator directly from equations that describe the system.

26. An apparatus for simulating a mixed-signal system as set forth in claim 15, wherein the operation of selecting independently selects the number of wavelets for each iteration.

27. An apparatus for simulating a mixed-signal system as set forth in claim 15, wherein the operation of selecting independently selects the set of wavelet basis functions for each iteration.

28. An apparatus for simulating a mixed-signal system as set forth in claim 15, further comprising an operation of receiving a specification for a system model and outputting the time-domain response of the system.

29. A computer program product for simulating a time-domain response of a mixed-signal system, the computer program product comprising computer-readable means stored on a computer-readable medium that are executable by a computer having a processor for causing the processor to perform the operations of:

breaking up a mixed-signal system simulation into clock periods;

generating a wavelet-based matrix operator representation of time-domain equations characterizing a mixed signal system, with the wavelet-based matrix operator representation including wavelet connection coefficients;

selecting a number of wavelets, a set of wavelet basis functions, and the wavelet-based matrix operator with which to represent a time domain performance of the system;

calculating a time-domain response of the mixed signal system by performing sequentially over a large number of clock cycles an act of:

iteratively applying the wavelet-based matrix operator within each clock period, wherein the large number of clock cycles is approximately greater than sixteen thousand three hundred and eighty four clock cycles and calculation within each clock period is weakly non-linear, and wherein the calculation within each clock period is performed by matrix multiplication, wherein the weakly non-linear calculation utilizes a linearity measure of approximately less than 50% of a linear portion of the mixed signal system; and outputting the time-domain response of the mixed signal system to an user, whereby the user can utilize the time-domain response of the mixed signal system to evaluate the behavioral performance of the system.

30. A computer program product for simulating a mixed-signal system as set forth in claim 29, where the system is an electrical circuit.

31. A computer program product for simulating a mixed-signal system as set forth in claim 30, where the electrical circuit is a delta-sigma modulator.

32. A computer program product for simulating a mixed-signal system as set forth in claim 31, wherein the operation of generating develops the wavelet-based matrix operator by a wavelet-Galerkin method.

33. A computer program product for simulating a mixed-signal system as set forth in claim 32, wherein the operation of generating develops the wavelet-based matrix operator directly from a system diagram or from equations that describe the system.

34. A computer program product for simulating a mixed-signal system as set forth in claim 33, wherein the operation of selecting independently selects the number of wavelets for each iteration.

35. A computer program product for simulating a mixed-signal system as set forth in claim 34, wherein the operation of selecting independently selects the set of wavelet basis functions for each iteration.

36. A computer program product for simulating a mixed-signal system as set forth in claim 35, further comprising an operation of receiving a specification for a system model and outputting the time-domain response of the system.

37. A computer program product for simulating a mixed-signal system as set forth in claim 29, wherein the operation of generating develops the wavelet-based matrix operator by a wavelet-Galerkin method.

38. A computer program product for simulating a mixed-signal system as set forth in claim 29, wherein the operation of generating develops the wavelet-based matrix operator directly from a system diagram.

39. A computer program product for simulating a mixed-signal system as set forth in claim 29, wherein the operation of generating develops the wavelet-based matrix operator directly from equations that describe the system.

40. A computer program product for simulating a mixed-signal system as set forth in claim 29, wherein the operation of selecting independently selects the number of wavelets for each iteration.

41. A computer program product for simulating a mixed-signal system as set forth in claim 29, wherein the operation of selecting independently selects the set of wavelet basis functions for each iteration.

42. A computer program product for simulating a mixed-signal system as set forth in claim 29, further comprising an operation of receiving a specification for a system model arid outputting the time-domain response of the system.

* * * * *